(12) United States Patent
Gibson

(10) Patent No.: US 12,200,852 B1
(45) Date of Patent: Jan. 14, 2025

(54) HEAT SINKS FOR ELECTRONIC CIRCUITS

(71) Applicant: Auradine Inc., Santa Clara, CA (US)

(72) Inventor: Glen Gibson, Santa Clara, CA (US)

(73) Assignee: Auradine Inc., Santa Clara, CA (US)

( * ) Notice: Subject to any disclaimer, the term of this patent is extended or adjusted under 35 U.S.C. 154(b) by 0 days.

(21) Appl. No.: 18/674,075

(22) Filed: May 24, 2024

(51) Int. Cl.
*H05K 1/02* (2006.01)

(52) U.S. Cl.
CPC ..... *H05K 1/0201* (2013.01); *H05K 2201/066* (2013.01)

(58) Field of Classification Search
CPC ........................................ H05K 1/0201–1/021
See application file for complete search history.

(56) References Cited

U.S. PATENT DOCUMENTS

| | | | |
|---|---|---|---|
| 9,622,380 B1* | 4/2017 | Joshi | H05K 7/20327 |
| 2013/0277813 A1* | 10/2013 | Torwesten | H01L 24/85 |
| | | | 257/676 |
| 2019/0343020 A1* | 11/2019 | Todorovic | H05K 9/0022 |

* cited by examiner

*Primary Examiner* — Jeremy C Norris
(74) *Attorney, Agent, or Firm* — Fish & Richardson P.C.

(57) ABSTRACT

A heat sink apparatus is provided. The heat sink apparatus includes a metal plate that includes a through hole, one or more hollow openings on a first surface of the metal plate, and a recessed groove on the first surface and navigating around the one or more hollow openings. The through hole is used to apply a differential force.

28 Claims, 5 Drawing Sheets

HEAT SINKS FOR ELECTRONIC CIRCUITS

TECHNICAL FIELD

The following disclosure generally relates to heat sinks, and in particular, to heat sinks for electronic circuits used in computing devices.

BACKGROUND

A heat sink for electronic circuits included in computing devices is a thermal management component designed to dissipate excess heat generated by the device's high-performance processors and electronic components. In large-scale computing environments, like data centers or server farms, effective heat sinks are needed for maintaining optimal operating temperatures, ensuring reliability, and maximizing the performance and lifespan of the computing hardware.

SUMMARY

The present disclosure describes methods, heat sink apparatus, and systems for providing cooling solutions.

In a general aspect, a heat sink apparatus includes a metal plate. The metal plate includes: a through hole configured to apply a differential force to the metal plate; one or more hollow openings on a first surface of the metal plate; and a recessed groove around a circumference of the first surface of the metal plate, wherein the recessed groove is configured with a shape that circumnavigates around the one or more hollow openings.

Particular implementations may include one or more of the following features.

In some implementations, the through hole extends from the first surface through the metal plate to a second surface that is opposite of the first surface of the metal plate.

In some implementations, the metal plate includes a plurality of heat dissipation fins extending from the second surface of the metal plate.

In some implementations, the plurality of heat dissipation fins are arranged in one or more of the following arrangements: parallel, radial, or staggered arrangements.

In some implementations, the metal plate includes one or more materials of aluminum or copper.

In some implementations, the heat sink apparatus further includes: a thermal interface material (TIM) attached to the first surface of the metal plate, the TIM includes a thermal tape having an adhesive side and a non-adhesive side, and the adhesive side of the thermal tape is adhered to the first surface of the metal plate.

In some implementations, the differential force includes vacuum.

In some implementations, the differential force is removable, and application of the differential force couples the heat sink apparatus to a boilerplate.

In some implementations, the heat sink apparatus further includes: a vacuum gasket attached to the recessed groove around the circumference of the first surface of the metal plate, wherein the vacuum gasket is configured to couple the heat sink apparatus to a boilerplate upon application of the differential force using the through hole.

In another aspect, a method for heat dissipation in an electronic system includes: providing a circuit board and a boilerplate coupled to the circuit board; coupling a heat sink to the boilerplate; applying a differential force to the heat sink to secure the heat sink to the boilerplate; and operating the circuit board at a specified power of the circuit board and under one or more ambient conditions.

Particular implementations may include one or more of the following features.

In some implementations, the heat sink includes a through hole, and wherein applying the differential force to the heat sink includes: applying vacuum to the heat sink using the through hole; and in response to applying vacuum to the heat sink using the through hole, coupling the heat sink to the boilerplate.

In some implementations, the method further includes: ceasing application of vacuum to the heat sink using the through hole; and in response to ceasing application of vacuum to the heat sink using the through hole, uncoupling the heat sink from the boilerplate.

In some implementations, the heat sink comprises a metal plate and a thermal interface material (TIM) attached to the metal plate, and coupling the heat sink to the boilerplate comprises adhering the TIM to a first surface of the metal plate that is attached to the boilerplate.

In some implementations, the TIM comprises a thermal tape having an adhesive side and a non-adhesive side, and the adhesive side of the thermal tape is adhered to the first surface of the metal plate.

In some implementations, the heat sink comprises a vacuum gasket adhered to a recessed groove around a circumference of the first surface of the metal plate that is attached to the boilerplate, and wherein coupling the heat sink to the boilerplate comprises coupling the heat sink to the boilerplate using a suction force of the vacuum gasket upon application of vacuum to the heat sink using a through hole.

In some implementations, operating the circuit board includes obtaining temperature data of the circuit board to assess a cooling efficiency of the heat sink, and wherein the temperature data comprises one of more of the following: a maximum temperature reached by the circuit board, a temperature differential across the heat sink, or a time period taken for a temperature of the circuit board to reach a known stable value.

In some implementations, the one or more ambient conditions include one or more of a preset temperature, a preset humidity, a preset air pressure, a preset light condition, a preset air quality, a preset acoustic environment setting, a preset electromagnet condition, or a preset altitude.

In some implementations, the circuit board includes a plurality of application-specific integrated circuit (ASIC) chips.

In some implementations, operating the circuit board at the specified power of the circuit board comprises testing the circuit board at a rated full power of the circuit board without using two-phase immersion cooling for heat dissipation.

In yet another aspect, a system includes a circuit board, a boilerplate, and the above-described heat sink.

In yet another aspect, a heat sink apparatus includes a metal plate and a lid coupled to the metal plate. The metal plate includes: a through hole used to apply a differential force to the metal plate; one or more hollow openings on a first surface of the metal plate; a recessed groove around a circumference of the first surface of the metal plate, wherein the recessed groove is configured to circumnavigate around the one or more hollow openings; and a basin formed on a second surface of the metal plate that is configured opposite of the first surface of the metal plate, wherein the basin comprises one or more inner walls forming a pathway in the basin to allow liquid to flow through the basin, and wherein the basin is configured to be filled with liquid. Particular implementations may include one or more of the following features.

In some implementations, the through hole extends from the first surface through the metal plate to a second surface of the metal plate that is opposite of the first surface of the metal plate.

In some implementations, the metal plate includes one or more materials of aluminum or copper.

In some implementations, the heat sink apparatus includes a thermal interface material (TIM) attached to the first surface of the metal plate, the TIM includes a thermal tape having an adhesive side and a non-adhesive side, and the adhesive side of the thermal tape is adhered to the first surface of the metal plate.

In some implementations, the differential force includes vacuum.

In some implementations, the differential force is removable, and application of the differential force couples the heat sink apparatus to a boilerplate.

In some implementations, heat sink apparatus further includes a vacuum gasket attached to the recessed groove around the circumference of the first surface of the metal plate, wherein the vacuum gasket is configured to couple the heat sink apparatus to a boilerplate upon application of the differential force using the through hole.

The details of one or more implementations of the subject matter of this disclosure are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1A:
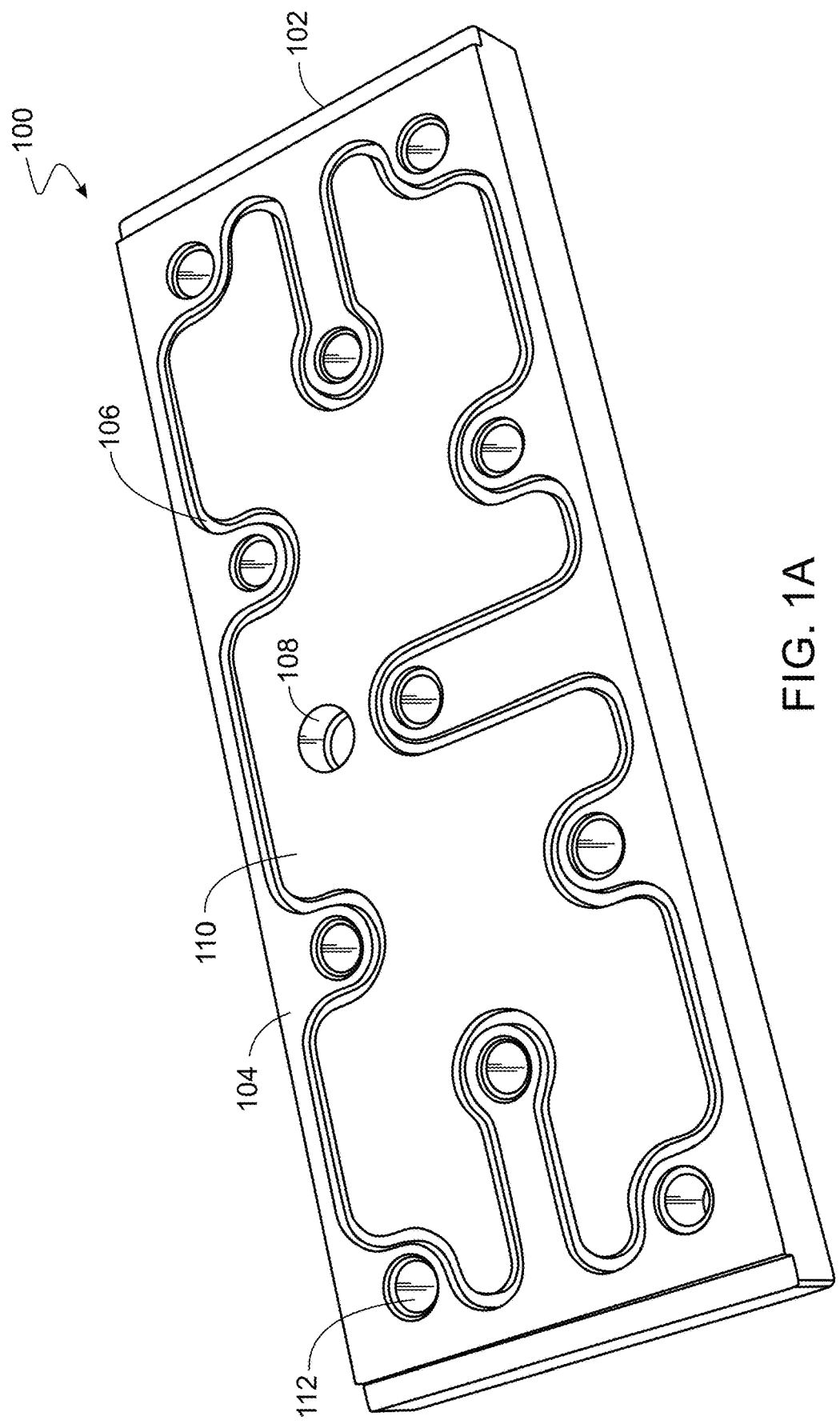
FIGS. 1A and 1B provide perspective views of an example heat sink, according to one or more implementations.

A large number of chips, such as ASICs, can be assembled on an electronic circuit board, such as a printed circuit board (PCB), to perform a computing task, e.g., parallel cryptographic hash computations, such as for blockchain operations, among others. The circuit board can have one or more ports to provide voltage supply and ground to the chips. The circuit board can also have one or more ports for the chips to receive data for performing the computation(s) and output data resulting from the computation(s). For tasks such as mining cryptocurrency (cryptomining), the computation performance is largely affected by the available computation power, which correlates to the number of chips performing the computation. Accordingly, it is desirable to increase the number of chips on the same circuit board. In this context, cryptocurrency is a digital currency that uses encryption to secure transactions and blockchain technology to verify transactions based on cryptographic hash computations. Examples of cryptocurrencies include, but are not limited to, Bitcoin, Ethereum, Kaspa, and Tether.

In the deployment of high-density application-specific integrated circuit (ASIC) boards, immersion cooling can be employed to manage heat dissipation. Yet, during the manufacturing process, it can be imperative to test these boards at their maximum operational capabilities to guarantee functionality. The requisite cooling for such intensive testing traditionally involves immersion cooling techniques, which, while effective, can be neither time nor cost-efficient for the testing phase, rendering them impractical. An alternative approach, employing bolted or screwed-on heatsinks, presents a less expensive option but suffers from inefficiency due to the labor-intensive process of attachment and removal.

The techniques described in this disclosure introduce an innovative solution to overcome the aforementioned challenges by employing a novel heatsink design that leverages vacuum pressure for attachment. These techniques not only can maintain the cost-effectiveness of traditional heatsinks but also can significantly reduce the time required for attachment and detachment, thereby streamlining the testing process without compromising on cooling performance. In some examples, the techniques described in this disclosure realize utilizing a combination of through holes, hollow opening, and a recessed groove in the heat sinks as described herein to facilitate sealing and coupling to another component by using differential force, such as vacuum. This design offers several advantages, such as enhanced sealing efficiency, improved structural integrity, versatile coupling capabilities, optimized thermal management, customized flow dynamics, and increased mechanical stability. This multi-faceted approach to sealing, involving various geometrical features, ensures a more robust and leak-proof seal. The combination of these features allows for versatile coupling options with a variety of components. This adaptability makes the heat sinks suitable for a wide range of applications in different fields. The described heat sinks may be used in conjunction with various cooling solutions, such as liquid cooling systems or forced air cooling, to handle the substantial thermal loads generated by these powerful computing devices.

Figure 1B:
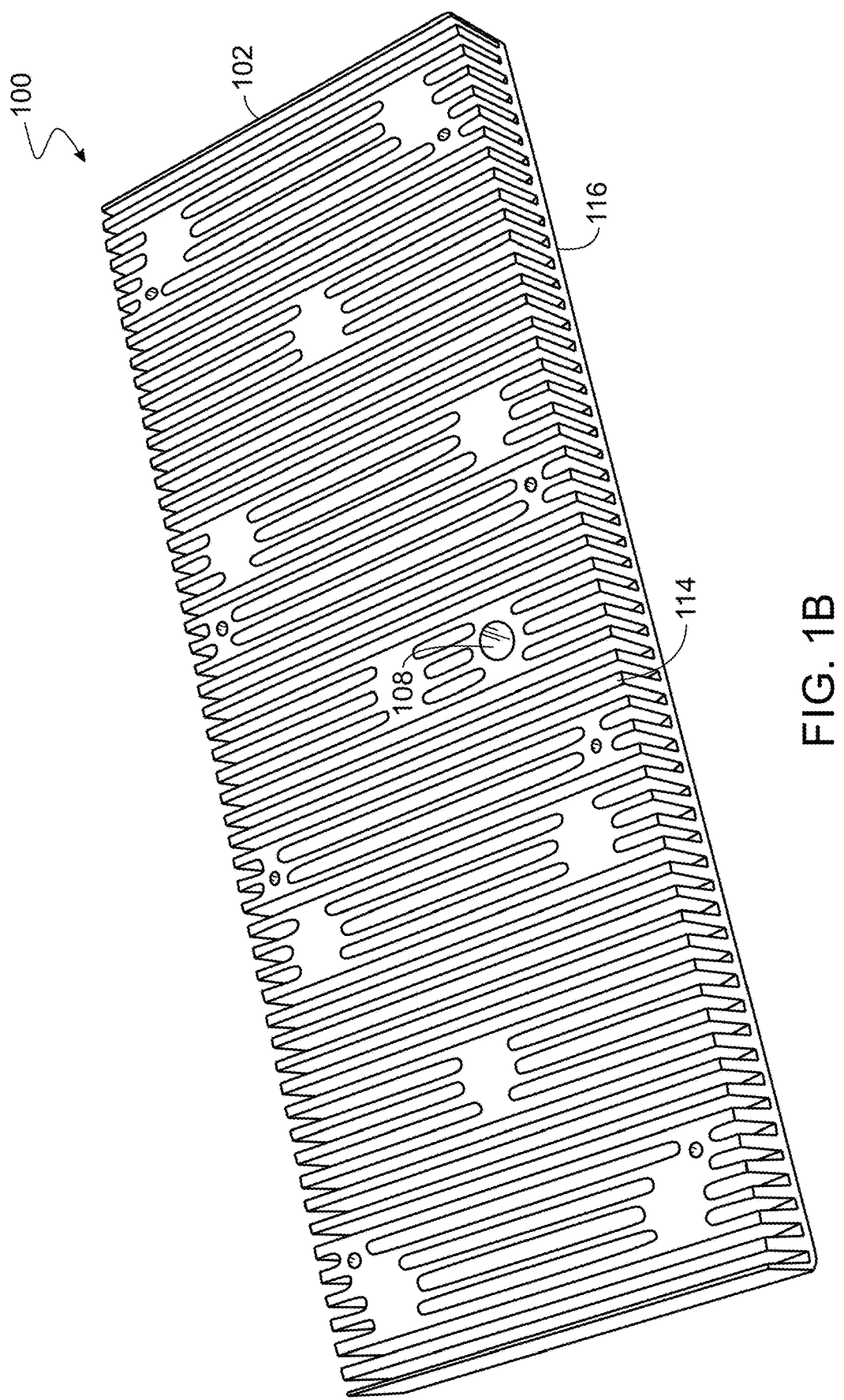

FIGS. 1A and 1B provide perspective views of an example heat sink 100, according to one or more implementations.

As shown in FIG. 1A, heat sink 100 includes a metal plate 102 and a thermal interface material (TIM) 110 coupled to metal plate 102. In some implementations, heat sink 100 includes one or more additional components other than metal plate 102, such as a vacuum gasket. In some implementations, metal plate 102 is composed of one or more materials with high thermal conductivity, which can efficiently transfer thermal energy (e.g., heat) from a hotter area (e.g., a CPU or another electronic component) to a cooler area (e.g., like the ambient air). In some examples, the materials of the metal plate 102 include one or more of aluminum, copper, other materials with high thermal conductivity, or composite materials.

In the example implementation shown, metal plate 102 has a rectangular shape. In some implementations, metal plate 102 can have any other suitable shape, such as a square, circular, or semi-circular shape, based on application requirement.

As shown, metal plate 102 includes recessed groove 106, through hole 108, and hollow openings 112. In some examples, recessed groove 106, through hole 108, and hollow openings 112 are configured to seal and couple metal plate 102 to another component, such as an electronic circuit board or a boilerplate, a boilerplate being used to dissipate heat in an immersion environment.

In some implementations, through hole 108 is used to apply a differential force to metal plate 102. In some examples, the differential force is vacuum. In some examples, a gasket is placed around a circumference of metal plate 102. In such examples, when a differential force, such as vacuum, is applied using the through hole 108 to couple heat sink 100 to another component, such as an electronic circuit board or a boilerplate, the gasket creates a vacuum-tight connection to ensure an effective and reliable seal to couple the heat sink 100 to another component. As shown, recessed groove 106 is formed around a circumference of first surface 104 of metal plate 102. In some implementations, a gasket, such as a vacuum gasket, is attached to the recessed groove 106. In such implementations, the vacuum gasket is configured to couple the heat sink 100 to an electronic circuit board upon application of a differential force using through hole 108.

The size, shape, and dimension of recessed groove 106 can be based on physical requirements of the vacuum gasket, the manufacturing capabilities, and the functional requirements of the heat sink 100. As shown by the illustrated example, recessed groove 106 is configured to have a shape that meanders or circumnavigates around hollow openings 112. This configured shape of the recessed groove 106 encloses an area on the surface 104 that excludes any hollow opening 112, while including the through hole 108 within the enclosed area. However, in some other cases, recessed groove 106 can have a rectangular or square shape. In some examples, recessed groove 106 can have a circular or semi-circular shape, when the vacuum gasket has a rounded edge or if this shape provides better attachment strength. In some examples, recessed groove 106 can have a shape that is customized to match the precise profile of the vacuum gasket, ensuring a snug fit.

In some implementations, the width and depth of recessed groove 106 match the dimensions of the vacuum gasket. For example, recessed groove 106 can have a depth that is determined to hold the vacuum gasket securely, but not so deep that it is difficult to insert or remove the vacuum gasket. In some examples, the vacuum gasket has a nominal diameter of 0.125 inches, and the groove 106 has dimensions of 0.125 inches wide by 0.11 inches deep. Other dimensions are also possible, for example, the vacuum gasket can have a diameter in the range of 0.1-0.5 inches, and the groove 106 can be 0.1-0.5 inches wide by 0.1-0.5 inches deep.

In some examples, the dimensional specifications of the through hole 108 is variable, contingent upon its intended function, ranging from a few millimeters for micro-scale applications to several centimeters for more extensive industrial uses. In some examples, the through hole 108 extends through the entire thickness of the metal plate 102, with its depth equating to the plate 102's thickness, with openings on first surface 102 and the opposite surface 116 (shown in FIG. 1B) of the metal plate 102.

In some examples, the through hole 108 can have a circular cross-section for case of machining and effective sealing. In some examples, the through hole 108 can have any suitable shape, such as square, rectangular, or bespoke shapes, to meet specific functional requirements.

In some implementations, the materials used for metal plate 102 and the vacuum gasket are selected by taking into consideration thermal expansion of the materials. The material of both the metal plate 102 and the vacuum gasket can expand and contract with temperature changes. Therefore, the groove design should accommodate this without losing grip on the vacuum gasket. In some examples, materials used for metal plate 102 and the vacuum gasket are selected such that the groove 106 and the vacuum gasket do not significantly impede the ability of heat sink 100 to dissipate heat.

As shown, in some examples, hollow openings 112 are distinct from the through hole 108, with the hollow openings 112 extending partially through the thickness of the metal plate 102, but without having openings on the opposite surface of the metal plate. These hollow openings may be used to fit over the mounting bolts of the circuit board or boilerplate, allowing the heat sink to sit flush with the boilerplate and allow for an effective seal of the vacuum gasket in recessed groove 106.

In some examples, the dimensions of the hollow openings 112 are variable, contingent upon its intended function, ranging from a few millimeters for micro-scale applications to several centimeters for more extensive industrial uses.

In some examples, hollow openings 112 can have a circular cross-section for case of machining and effective sealing. In some examples, hollow openings 112 can have any suitable shape, such as square, rectangular, or bespoke shapes, to meet specific functional requirements.

Utilizing a combination of a recessed groove 106, through hole 108, and hollow openings 112 in metal plate 102 to facilitate sealing and coupling to another component offers several advantages, such as enhanced sealing efficiency, improved structural integrity, versatile coupling capabilities, optimized thermal management, customized flow dynamics, and increased mechanical stability. This multi-faceted approach to sealing, involving various geometrical features, ensures a more robust and leak-proof seal. The combination of these features allows for versatile coupling options with a variety of components. This adaptability makes the metal plate suitable for a wide range of applications in different fields. In applications where heat transfer is crucial, such as in electronics cooling, the design can facilitate improved thermal management through effective heat distribution and dissipation. The interlocking nature of the components, facilitated by the design, enhances the mechanical stability of the coupled system, reducing the likelihood of dislodgement or detachment under operational conditions.

In the example shown, thermal interface material (TIM) 110 is coupled to metal plate 102 to enhance the thermal conductivity between the heat sink 100 and the circuit component the heat sink 100 is cooling, such as an electronic circuit board or a boilerplate. As shown, TIM 110 covers a substantial area of surface 104 of metal plate 102. For example, in some implementations, TIM 100 covers between 50% and 80% of the surface 104. In the example shown, TIM 110 is configured with a shape having a perimeter that matches the shape of the recessed groove 106, and TIM 110 is positioned to be constrained on the surface 104 within an area that is enclosed by the recessed groove 106.

In some examples, TIM 110 is composed of, and/or includes a material with high thermal conductivity, such as silicone, metal oxides, graphite, or silver or gold particles.

In some examples, TIM 110 can have a thickness in the range of a few micrometers to a few millimeters.

In some examples, TIM 110 can range from viscous to solid, depending on the form e.g., paste, pad, or film. In examples where metal plate 102 includes micro-irregularities on its surfaces, pastes can be used as TIM 110. In examples where metal plate 102 have smooth surfaces, pads or films can be used as TIM 110 to provide a more uniform thickness.

In some examples, TIM 110 can be adhesive. In some examples, the TIM 110 can be a thermal tape having an adhesive side and a non-adhesive side, and the adhesive side of the thermal tape is adhered to a surface of the metal plate 102.

In some implementations, heat sink 100 includes additional components designed for facilitating heat dissipation. In some examples, heat sink 100 can include heat dissipation fins for air-cooling, or a basin or cavities for liquid-cooling. As shown in FIG. 1B, heat sink 100 has a second surface 116, which is configured opposite of first surface 104. In the example shown, heat dissipation fins 114 extend from second surface 116.

Heat dissipation fins 114 can be designed to enhance the thermal management capabilities of the heat sink 100. In some implementations, heat dissipation fins 114 have a predetermined height, width, and spacing between the heat dissipation fins 114, based on mechanical specification and heat dissipation requirement of heat sink 100. In some examples, the height of the heat dissipation fins 114 can be proportionate to the desired heat dissipation rate. Taller fins can dissipate more heat but might also be more prone to mechanical damage and can increase the overall size of the device. The thickness of each fin affects both heat conduction and mechanical stability. Thinner fins can transfer heat more quickly but may be less durable. The spacing affects air flow between fins. Wider spacing allows more air to flow through, which can improve cooling but might reduce the total surface area available for heat transfer.

In the show example, the heat dissipation fins 114 are arranged in parallel rows. In some examples, heat dissipation fins 114 can be arranged in one or more of the following arrangements: parallel, radial, or staggered arrangements. For example, radial or circular arrangement can be used in cylindrical or round heat sinks where air flow is multidirectional. Staggered arrangement can be used to disrupt laminar flow and increase the turbulence of air passing through, which can enhance heat transfer.

In some examples, the heat dissipation fins 114 can be rectangular or square fins. In some examples, the heat dissipation fins 114 can be tapered or trapezoidal fins, which can be used to optimize air flow and heat dissipation in specific conditions. In some examples, the heat dissipation fins 114 can have custom shapes to maximize efficiency or fit into specific spaces, depending on the particular application. The size, shape, arrangement, and number of the heat dissipation fins 114 can be designed to maximize the surface area of the fins for effective heat dissipation.

In some implementations, heat dissipation fins 114 are integrated into metal plate 102. In such implementations, heat dissipation fins can have a same material of metal plate 102.

In some implementations, heat dissipation fins 114 have a different material from metal plate 102. In such implementations, the material of heat dissipation fins 114 is compatible with the material of the metal plate in terms of thermal conductivity.

In some examples, heat dissipation fins 114 can have a material of aluminum, copper, or graphite.

Figure 2A:
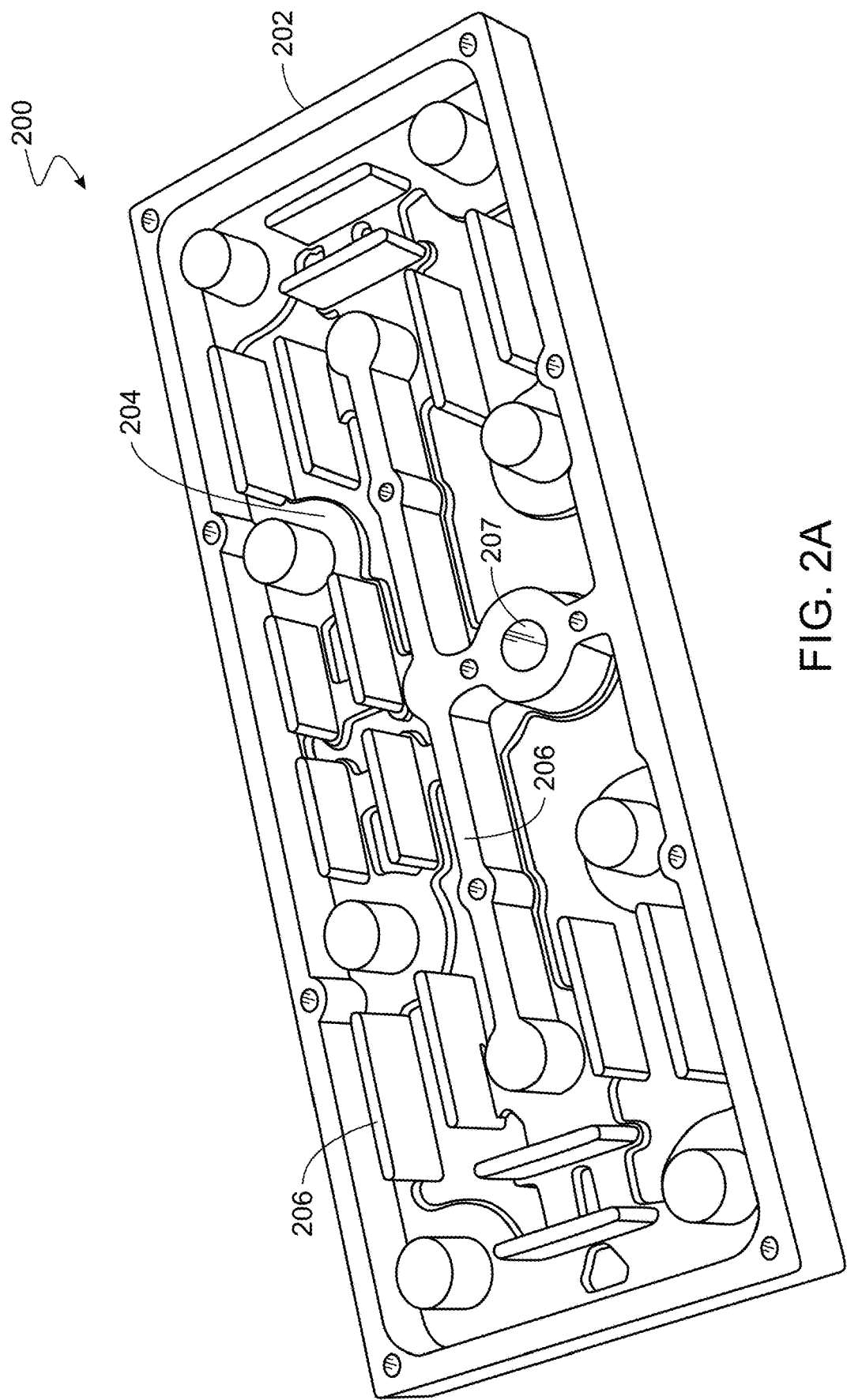
FIGS. 2A and 2B provide perspective views of an example heat sink, according to one or more implementations.

FIG. 2A illustrates an example heat sink 200 including a metal plate 202, according to one or more implementations. In some implementations, heat sink 200 is configured for liquid-cooling. In some implementations, metal plate 202 is composed of and/or includes one or more materials with high thermal conductivity, which can efficiently transfer thermal energy (e.g., heat) from a hotter area (e.g., a CPU or another electronic component) to a cooler area (e.g., liquid). For example, metal plate 202 can include one or more materials of aluminum, copper, or composite materials.

In the example shown, metal plate 202 has a rectangular shape. In some examples, metal plate 202 can have any suitable shape, such as a square, circular, or semi-circular shape, based on application requirement.

In some implementations, metal plate 202 has a surface (not shown) similar to first surface 104 of FIG. 1A. In such implementations, a recessed groove similar to recessed groove 106, a through hole similar to through hole 108, and hollow openings similar to hollow opening to 112, are formed in metal plate 202. Accordingly, some descriptions of metal plate 202 are omitted here for brevity.

In some examples, metal plate 202 can include different numbers of elements compared to metal plate 102. For example, metal plate 202 can have more through holes, such as two through holes, than metal plate 102, according to particular application. As another example, metal plate 202 can have a smaller number of hollow openings than metal plate 102.

As shown in FIG. 2A, on the other surface of metal plate 202 that is opposite to the surface wherein the recessed groove is located, a basin 204 is configured. In the example shown, basin 204 has a rectangular shape. In some examples, basin 204 can have any suitable shape, such as circular, oval, or rectangular, depending on the application requirements. The depth of basin 204 can vary from a few millimeters to several centimeters, based on intended use.

Basin 204 includes inner walls 206 to form a pathway that is configured to allow liquid to flow through basin. As shown in FIG. 2A, in some examples basin 204 can have a plurality of inner walls that are configured or arranged in the form of a maze. In some examples, basin 204 can have additional inner wall(s) and/or additional component(s) to form different pathway(s) than the pathway of FIG. 2A, depending on application requirements.

Similar to through hole 108 in FIGS. 1A and 1B, through hole 207 is used to apply a differential force to metal plate 202. When a differential force, such as vacuum, is applied using the through hole 207 to couple heat sink 200 to another component, such as an electronic circuit board or a boilerplate, a vacuum-tight connection can be created to ensure an effective and reliable seal to couple the heat sink 200 to another component.

Figure 2B:
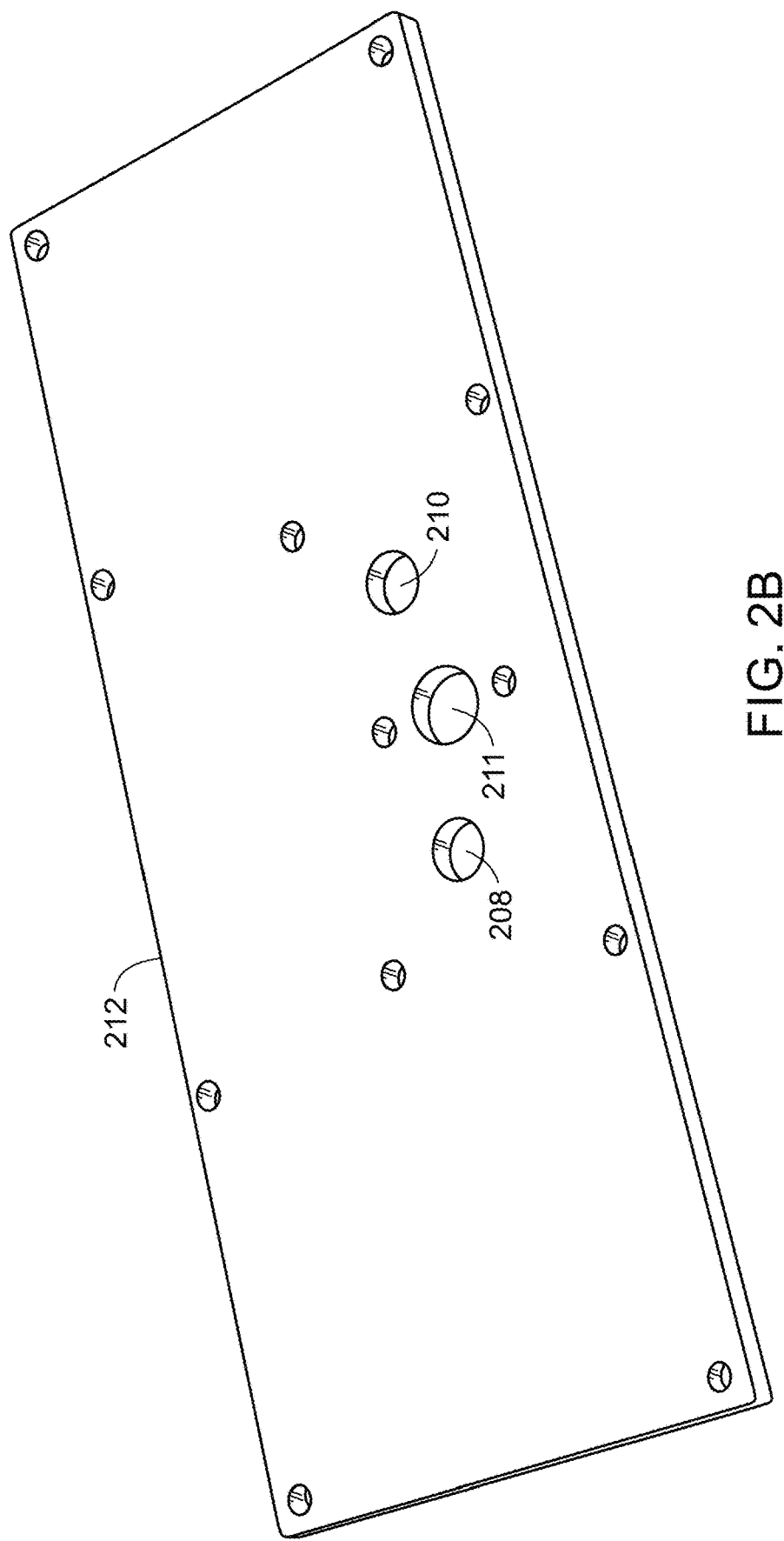

Heat sink 200 can further include a plate, such as plate 212 of FIG. 2B, that is configured as a lid to cover basin 204. In some implementations, plate 212 has the same material as metal plate 202. In some implementations, plate 212 has a different material from metal plate 202. In some examples, plate 212 has one or more materials of aluminum, copper, graphite, or composite materials. In the example shown, plate 212 includes openings 208 and 210 that allow liquid to flow through basin 204 by entering one opening, such as opening 208 and exiting the other opening, such as opening 210 (or vice versa). Plate 212 further includes an opening 211 that is aligned with through hole 207 when plate 212 is coupled to metal plate 202. In some implementations, opening 211 is configured to allow a vacuum port to pass through plate 212 and through hole 207.

Figure 3:
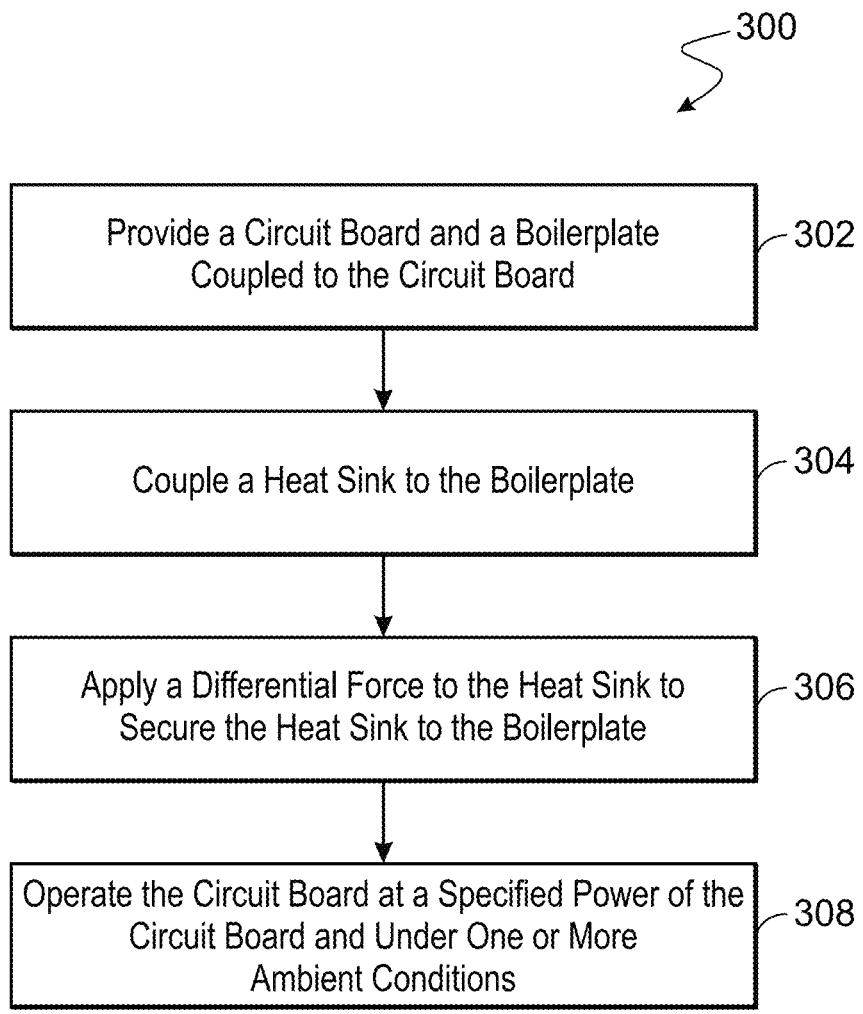
FIG. 3 shows a flowchart of an example process for heat dissipation, according to one or more implementations.

FIG. 3 shows a flowchart of an example process 300 for heat dissipation, according to one or more implementations. Process 300 can be practically carried out in laboratory or industrial facilities or simulatively performed on a computer-aid design (CAD) software platform. It is to be noted that although process steps, method steps, algorithms or the like may be described in a sequential order above, such processes, methods and algorithms may generally be configured to work in alternate orders, unless specifically stated to the contrary. In some implementations, process 300 is performed using heat sink 100 or heat sink 200. Accordingly, process 300 is described in the following section with reference to heat sink 100 or heat sink 200, or both.

In process 300, a circuit board and a boilerplate coupled to the circuit board are provided (302). In some implementations, the circuit board includes a plurality of application-specific integrated circuit (ASIC) chips.

A heat sink is coupled to the boilerplate (304). For example, in some implementations, heat sink 100 or heat sink 200 is coupled to the boilerplate. In such implementations, the heat sink includes a through hole, (e.g., through hole 108 or through hole 207). In some implementations, the heat sink includes a metal plate (e.g., metal plate 102 or plate 212). In some implementations, the heat sink (e.g., heat sink 100) also includes a thermal interface material (TIM) (e.g., TIM 110) attached to the metal plate. In such implementations, coupling the heat sink to the boilerplate comprises adhering the TIM to a first surface of the metal plate that is attached to the boilerplate.

In some examples, the TIM comprises a thermal tape having an adhesive side and a non-adhesive side, and the adhesive side of the thermal tape is attached to the first surface of the metal plate.

In some implementations, the heat sink includes a vacuum gasket adhered to a recessed groove (e.g., recessed groove 106) at the first surface of the metal plate that is attached to the boilerplate. In such implementations, coupling the heat sink to the boilerplate includes coupling the heat sink to the boilerplate using a suction force of the vacuum gasket upon application of vacuum to the heat sink using a through hole.

A differential force is applied to the heat sink to secure the heat sink to the boilerplate (306). In some implementations, applying the differential force to the heat sink includes applying vacuum to the heat sink using the through hole of the heat sink (e.g., using though hole 108 of heat sink 100 or through hole 207 of heat sink 200).

The circuit board is operated at a specified power of the circuit board and under one or more ambient conditions (308). For example, in some implementations, the circuit board is tested at a full rated power of the circuit board, with the heat sink (e.g., heat sink 100 or heat sink 200) coupled to the boilerplate. Testing the circuit board in this manner includes obtaining temperature data of the circuit board to assess a cooling efficiency of the heat sink, and wherein the temperature data comprises one or more of the following: a maximum temperature reached by the circuit board, a temperature differential across the heat sink, or a time period taken for a temperature of the circuit board to reach a known stable value.

In some implementations, the one or more ambient conditions include one or more of a preset temperature, a preset humidity, a preset air pressure, a preset light condition, a preset air quality, a preset acoustic environment setting, a preset electromagnet condition, or a preset altitude.

In some implementations, testing the circuit board at the full power of the circuit board includes testing the circuit board without using two-phase immersion cooling for heat dissipation.

Two-phase immersion cooling is a method used for cooling electronic components, particularly in high-density computing environments like data centers. This technique involves immersing electronic components or entire systems in a non-conductive liquid. The process is termed "two-phase" because it involves liquid-to-vapor phase change. In a typical two-phase immersion cooling process, electronic components are submerged in a specially engineered fluid. This fluid is dielectric, meaning it does not conduct electricity, ensuring the safe operation of the electronics. The fluid is chosen for its low boiling point, which is significantly lower than water. As the electronic components generate heat, the surrounding fluid absorbs this heat and begins to boil. The heat absorption causes the liquid to vaporize (change from liquid to gas). The vapor then rises and condenses on a heat exchanger or a condenser unit within the system. Upon condensation, the heat is removed from the vapor, and it turns back into a liquid. The condensed liquid is then cycled back into the cooling bath to absorb more heat from the electronic components, creating a continuous cooling cycle.

Two-phase immersion cooling, while highly efficient, presents several challenges that need to be addressed for its effective implementation. For example, the setup and maintenance cost for a two-phase immersion cooling system can be significantly higher than traditional air-cooling systems. This includes the cost of the cooling fluid, specialized equipment, and containment systems. Over time, the cooling fluid can degrade or become contaminated, requiring monitoring and periodic replacement. Furthermore, not all electronic components or materials may be compatible with the immersion fluid, potentially leading to corrosion or other forms of degradation.

Testing the circuit board using the described heat sink instead of using two-phase immersion cooling for heat dissipation offer several advantages including lower setup and maintenance costs, simpler and more familiar design and maintenance, and broader compatibility with standard electronic components. Furthermore, tested systems using the described heat sink can be easier to scale and modify, requiring less specialized infrastructure and handling, and posing fewer environmental concerns related to special cooling fluids.

In some implementations, the circuit board is operated during deployment at a specified power of the circuit board to perform intended functions, with the heat sink (e.g., heat sink 100 or heat sink 200) coupled to the boilerplate. This can be the case, for example, when the circuit board is used without two-phase immersion cooling. In such cases, the heat sink is used to provide heat dissipation during regular use that is comparable to the heat dissipation achievable using two-phase immersion cooling. In scenarios where two-phase immersion cooling is not employed, the heat sink can serve a critical role in dissipating heat from the circuit board. The effectiveness of the heat sink in this context can be engineered to approximate the level of heat dissipation that would be achieved if two-phase immersion cooling were used. This can ensure that the circuit board maintains desired thermal conditions for reliable performance during regular operation, thereby preventing overheating and potential damage, even when cooling solutions are limited.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A heat sink apparatus comprising:
    a metal plate, wherein the metal plate comprises:
        a through hole configured to apply a differential force to the metal plate, wherein the differential force comprises vacuum;
        one or more hollow openings on a first surface of the metal plate; and
        a recessed groove around a circumference of the first surface of the metal plate, wherein the recessed groove is configured with a shape that circumnavigates around the one or more hollow openings.

2. The heat sink apparatus according to claim 1, wherein the through hole extends from the first surface through the metal plate to a second surface that is opposite of the first surface of the metal plate.

3. The heat sink apparatus according to claim 2, wherein the metal plate comprises a plurality of heat dissipation fins extending from the second surface of the metal plate.

4. The heat sink apparatus according to claim 3, wherein the plurality of heat dissipation fins are arranged in one or more of the following arrangements: parallel, radial, or staggered arrangements.

5. The heat sink apparatus according to claim 1, wherein the metal plate comprises one or more materials of aluminum or copper.

6. The heat sink apparatus according to claim 1, further comprising:
    a thermal interface material (TIM) attached to the first surface of the metal plate, the TIM comprises a thermal tape having an adhesive side and a non-adhesive side, and the adhesive side of the thermal tape is adhered to the first surface of the metal plate.

7. The heat sink apparatus according to claim 1, wherein the differential force is removable, and wherein application of the differential force couples the heat sink apparatus to a boilerplate.

8. The heat sink apparatus according to claim 1, further comprising:
    a vacuum gasket attached to the recessed groove around the circumference of the first surface of the metal plate, wherein the vacuum gasket is configured to couple the heat sink apparatus to a boilerplate upon application of the differential force using the through hole.

9. A method for heat dissipation in an electronic system, the method comprising:
    providing a circuit board and a boilerplate coupled to the circuit board;
    coupling a heat sink to the boilerplate;
    applying a differential force to the heat sink to secure the heat sink to the boilerplate, wherein the differential force comprises vacuum; and
    operating the circuit board at a specified power of the circuit board and under one or more ambient conditions.

10. The method according to claim 9, wherein the heat sink comprises a through hole, and wherein applying the differential force comprising vacuum to the heat sink comprises:
    applying the differential force comprising vacuum to the heat sink using the through hole; and
    in response to applying vacuum to the heat sink using the through hole, coupling the heat sink to the boilerplate.

11. The method according to claim 10, further comprising:
    ceasing application of vacuum to the heat sink using the through hole; and
    in response to ceasing application of vacuum to the heat sink using the through hole, uncoupling the heat sink from the boilerplate.

12. The method according to claim 9, wherein the heat sink comprises a metal plate and a thermal interface material (TIM) attached to the metal plate, and coupling the heat sink to the boilerplate comprises adhering the TIM to a first surface of the metal plate that is attached to the boilerplate.

13. The method according to claim 12, wherein the TIM comprises a thermal tape having an adhesive side and a non-adhesive side, and the adhesive side of the thermal tape is adhered to the first surface of the metal plate.

14. The method according to claim 12, wherein the heat sink comprises a vacuum gasket adhered to a recessed groove around a circumference of the first surface of the metal plate that is attached to the boilerplate, and wherein coupling the heat sink to the boilerplate comprises coupling the heat sink to the boilerplate using a suction force of the vacuum gasket upon application of vacuum to the heat sink using a through hole.

15. The method according to claim 9, wherein operating the circuit board comprises obtaining temperature data of the circuit board to assess a cooling efficiency of the heat sink, and wherein the temperature data comprises one of more of the following: a maximum temperature reached by the circuit board, a temperature differential across the heat sink, or a time period taken for a temperature of the circuit board to reach a known stable value.

16. The method according to claim 9, wherein the one or more ambient conditions comprise one or more of a preset temperature, a preset humidity, a preset air pressure, a preset light condition, a preset air quality, a preset acoustic environment setting, a preset electromagnet condition, or a preset altitude.

17. The method according to claim 9, wherein the circuit board comprises a plurality of application-specific integrated circuit (ASIC) chips.

18. The method according to claim 9, wherein operating the circuit board at the specified power of the circuit board comprises testing the circuit board at a rated full power of the circuit board without using two-phase immersion cooling for heat dissipation.

19. A system comprising:
    a circuit board;
    a boilerplate; and
    a heat sink, wherein the boilerplate is disposed between the heat sink and the circuit board, and wherein the heat sink includes a metal plate that comprises:
        a through hole configured to apply a differential force to the metal plate, wherein the differential force comprises vacuum;
        one or more hollow openings on a first surface of the metal plate; and
        a recessed groove around a circumference of the first surface of the metal plate, wherein the recessed groove is configured with a shape that circumnavigates around the one or more hollow openings.

20. The system according to claim 19, wherein the system further comprises a cooling device coupled to the heat sink.

21. The system according to claim 20, wherein the cooling device comprises a liquid-cooling device or an air-cooling device.

22. The system according to claim 19, wherein the heat sink further comprises:
a vacuum gasket attached to the recessed groove around the circumference of the first surface of the metal plate,
wherein the vacuum gasket is configured to couple the heat sink to a boilerplate upon application of the differential force using the through hole.

23. A heat sink apparatus comprising:
a metal plate;
a lid coupled to the metal plate, wherein the metal plate comprises:
a through hole used to apply a differential force to the metal plate;
one or more hollow openings on a first surface of the metal plate;
a recessed groove around a circumference of the first surface of the metal plate, wherein the recessed groove is configured to circumnavigate around the one or more hollow openings;
a basin formed on a second surface of the metal plate that is configured opposite of the first surface of the metal plate, wherein the basin comprises one or more inner walls forming a pathway in the basin to allow liquid to flow through the basin, and wherein the basin is configured to be filled with liquid; and
a thermal interface material (TIM) attached to the first surface of the metal plate, the TIM comprises a thermal tape having an adhesive side and a non-adhesive side, and the adhesive side of the thermal tape is adhered to the first surface of the metal plate.

24. The heat sink apparatus according to claim 23, wherein the through hole extends from the first surface through the metal plate to a second surface of the metal plate that is opposite of the first surface of the metal plate.

25. The heat sink apparatus according to claim 23, wherein the metal plate comprises one or more materials of aluminum or copper.

26. The heat sink apparatus according to claim 23, wherein the differential force comprises vacuum.

27. The heat sink apparatus according to claim 23, wherein the differential force is removable, and wherein application of the differential force couples the heat sink apparatus to a boilerplate.

28. The heat sink apparatus according to claim 23, further comprising:
a vacuum gasket attached to the recessed groove around the circumference of the first surface of the metal plate,
wherein the vacuum gasket is configured to couple the heat sink apparatus to a boilerplate upon application of the differential force using the through hole.

* * * * *